United States Patent
Ohta et al.

(10) Patent No.: US 8,552,476 B2
(45) Date of Patent: Oct. 8, 2013

(54) SCHOTTKY BARRIER DIODE AND MOSFET SEMICONDUCTOR DEVICE

(75) Inventors: Tsuyoshi Ohta, Yokohama (JP); Masatoshi Arai, Fuchu (JP); Miwako Suzuki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/236,588

(22) Filed: Sep. 19, 2011

(65) Prior Publication Data
US 2012/0241853 A1    Sep. 27, 2012

(30) Foreign Application Priority Data
Mar. 25, 2011 (JP) ................... P2011-67475

(51) Int. Cl.
  H01L 29/80 (2006.01)
  H01L 29/66 (2006.01)
  H01L 29/76 (2006.01)
  H01L 29/47 (2006.01)
(52) U.S. Cl.
  USPC ........... 257/267; 257/256; 257/263; 257/280; 257/288; 257/471; 257/476; 257/E29.002; 257/E29.013; 257/E29.148
(58) Field of Classification Search
  USPC ......... 257/260, 263, 267, 256, 280, 288, 471, 257/476, E29.002, E29.013, E29.148
  See application file for complete search history.

(56) References Cited

U.S. PATENT DOCUMENTS

| | | | |
|---|---|---|---|
| 6,351,018 B1 | 2/2002 | Sapp | |
| 7,091,573 B2* | 8/2006 | Hirler et al. | 257/500 |
| 2002/0030237 A1* | 3/2002 | Omura et al. | 257/397 |
| 2003/0001203 A1* | 1/2003 | Ono et al. | 257/330 |
| 2006/0186506 A1* | 8/2006 | Tanaka et al. | 257/484 |
| 2008/0102557 A1* | 5/2008 | Kim et al. | 438/73 |
| 2008/0182376 A1* | 7/2008 | Pattanayak et al. | 438/270 |
| 2008/0199997 A1* | 8/2008 | Grebs et al. | 438/270 |
| 2009/0283776 A1* | 11/2009 | Iwamuro | 257/76 |
| 2011/0062493 A1* | 3/2011 | Miyoshi et al. | 257/190 |

* cited by examiner

*Primary Examiner* — Julio J Maldonado
*Assistant Examiner* — Cory Eskridge
(74) *Attorney, Agent, or Firm* — Patterson & Sheridan, LLP

(57) ABSTRACT

A semiconductor layer has a second impurity concentration. First trenches are formed in the semiconductor layer to extend downward from an upper surface of the semiconductor layer. Each of insulation layers is formed along each of the inner walls of the first trenches. Each of conductive layers is formed to bury each of the first trenches via each of the insulation layers, and extends downward from the upper surface of the semiconductor layer to a first position. A first semiconductor diffusion layer reaches a second position from the upper surface of the semiconductor layer, is positioned between the first trenches, and has a third impurity concentration lower than the second impurity concentration. A length from the upper surface of the semiconductor layer to the second position is equal to or less than half a length from the upper surface of the semiconductor layer to the first position.

5 Claims, 9 Drawing Sheets

SCHOTTKY BARRIER DIODE AND MOSFET SEMICONDUCTOR DEVICE

CROSS-REFERENCE TO RELATED APPLICATIONS

This application is based upon and claims the benefit of priority from the prior Japanese Patent Application No. 2011-67475, filed on Mar. 25, 2011, the entire contents of which are incorporated herein by reference.

FIELD

Embodiments described herein relate to a semiconductor device.

BACKGROUND

As a technique of reducing the on resistance of a power MOSFET, a MOSFET of a trench MOS structure is known. This MOSFET of the trench MOS structure has a plurality of trenches in a semiconductor layer at predetermined intervals. The semiconductor layer serves as a channel area. In an inner wall of this trench, an insulation film which serves as a gate insulation film is formed, and a conductive layer which serves as a gate electrode is embedded in the trench via this insulation film. By miniaturizing the width of this trench and width of the semiconductor layer between the trenches, it is possible to increase the channel density in an element.

A structure is known in which a schottky barrier diode (SBD) is formed using this trench MOS structure. Further, a Merge PIN Schottky (MPS) structure is known as another structure, and uses a P type diffusion layer instead of a trench MOS. The SBD using the above trench MOS structure provides a withstand voltage at an epitaxial ratio resistance lower than in the MPS structure, and consequently, can provide an advantage that a forward voltage drop is low. Further, upon a reverse bias, by expanding a depletion layer between trenches, it is possible to withstand a reverse bias voltage.

However, while a schottky barrier diode using the trench MOS structure has a small on resistance upon a forward bias, the schottky barrier diode has a problem in that a leak current is great upon application of a reverse bias. Although it is possible to suppress a leak current by decreasing the interval between trenches, in this case, there is a problem in that a forward voltage upon a forward bias increases and the on resistance increases.

Hence, a schottky barrier diode is demanded which can suppress an increase of the leak current upon a reverse bias while maintaining a small on resistance upon a forward bias.

DETAILED DESCRIPTION

A semiconductor device according to an aspect includes a cathode electrode, a semiconductor substrate of a first conductivity type, a semiconductor layer of the first conductivity type, a plurality of first trenches, a plurality of insulation layers, a plurality of conductive layers, a first semiconductor diffusion layer, and an anode electrode. The semiconductor substrate is electrically connected to the cathode electrode, and has a first impurity concentration. The semiconductor layer is formed on the semiconductor substrate, and has a second impurity concentration lower than the first impurity concentration. The first trenches are formed in the semiconductor layer to extend downward from an upper surface of the semiconductor layer. Each of the insulation layers is formed along each of inner walls of the first trenches. Each of the conductive layers is formed to bury each of the first trenches via each of the insulation layers, and extends downward from the upper surface of the semiconductor layer to a first position. The first semiconductor diffusion layer reaches a second position from the upper surface of the semiconductor layer, is positioned between the first trenches, and has a third impurity concentration lower than the second impurity concentration. The anode electrode is formed on upper surfaces of the first semiconductor diffusion layer and the conductive layers, and has a schottky junction with the first semiconductor diffusion layer. A length from the upper surface of the semiconductor layer to the second position is equal to or less than half a length from the upper surface of the semiconductor layer to the first position.

Hereinafter, a semiconductor device according to embodiments will be described with reference to the drawings.

First Embodiment

Configuration

Figure 1:
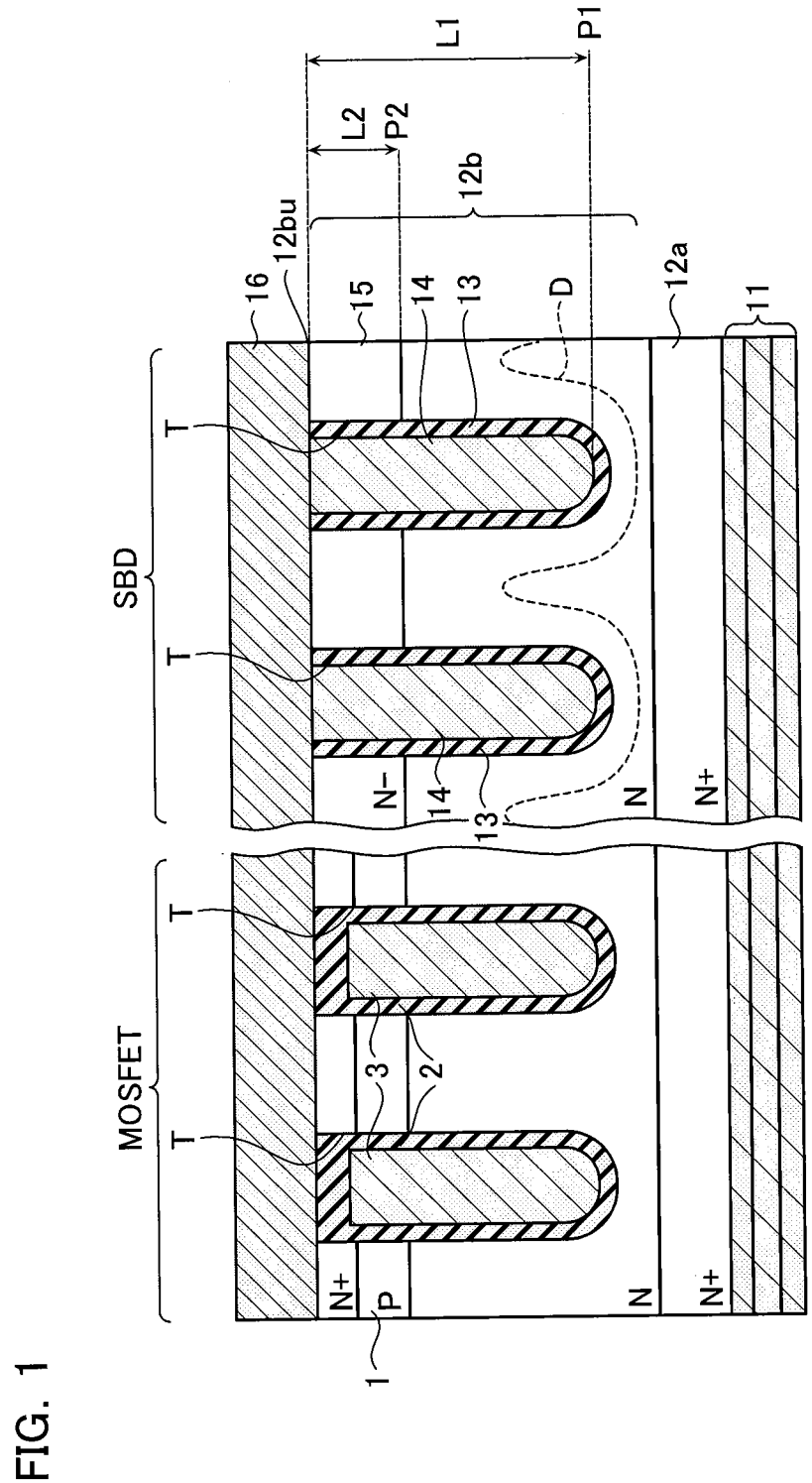
FIG. 1 is a sectional view of a semiconductor device according to a first embodiment.

First, a layered structure of a semiconductor device according to a first embodiment will be described with reference to FIG. 1. FIG. 1 is a sectional view of a semiconductor device according to the first embodiment. As illustrated in FIG. 1, the semiconductor device according to the first embodiment has, for example, a MOSFET of a trench MOS structure, and a schottky barrier diode SBD using the above trench MOS structure. In addition, although the MOSFET and schottky barrier diode SBD are provided in the present embodiment, the present embodiment is also applicable to a semiconductor device which has only a schottky barrier diode SBD.

As illustrated in FIG. 1, the MOSFET according to the present embodiment has a plurality of trenches T at predetermined intervals in a P type semiconductor layer 1 which serves as a channel area. In the inner wall of these trenches T, an insulation film 2 which serves as a gate insulation film is formed, and a conductive film 3 which serves as a gate electrode is embedded in the trenches T via the insulation film 2.

As illustrated in FIG. 1, the schottky barrier diode SBD according to the present embodiment has a cathode electrode 11, an N+ type semiconductor substrate 12a, an N type drift layer 12b, an insulation layer 13, a conductive layer 14, an N− type diffusion layer 15 and an anode electrode 16. In addition, "N− type" means a lower impurity concentration than "N type", and "N type" means a lower impurity concentration than "N+ type".

The cathode electrode 11 is formed of three-layered materials of titanium (Ti), nickel (Ni) and gold (Au). The N+ type semiconductor substrate 12a is formed on a upper surface of the cathode electrode 11, and is electrically connected to the cathode electrode 11.

The N type drift layer 12b is formed on the N+ type semiconductor substrate 12a, and has a lower impurity concentration than that of the N+ type semiconductor substrate 12a. The N type drift layer 12b has a plurality of trenches T extending downward from an upper surface 12bu of the N type drift layer 12b. The plurality of trenches T extend in a longitudinal direction which is the vertical direction to the plane of paper in FIG. 1, and are formed at predetermined intervals in the lateral direction to the plane of paper. The width of one trench T is, for example, 200 to 1000 nm, and the interval between the two trenches T are, for example, 200 to 1000 nm.

The insulation layer 13 is formed along the inner wall of the trench T and has the film thickness of, for example, 20 to 100 nm. The conductive layer 14 is electrically connected to the anode electrode 16, and is formed to bury the trench T via the insulation layer 13. Specifically, the conductive layer 14 is formed to reach the position P1 from the upper surface 12bu of the N type drift layer 12b.

The N− type diffusion layer 15 is formed on the surface of the N type drift layer 12b between a plurality of trenches T forming the schottky barrier diode SBD. The N− type diffusion layer 15 is formed to reach the position P2 from the upper surface 12bu of the N type drift layer 12b. Meanwhile, a length L2 from the upper surface 12bu of the N type drift layer 12b to the position P2 is equal to or less than half a length L1 from the upper surface 12bu of the N type drift layer 12b to the position P1 and is preferably one fifth (⅕) to half (½).

The concentration of the N− type diffusion layer 15 is lower than the concentration of the N type drift layer 12b. For example, the concentration of the N− type diffusion layer 15 is $5 \times 10^{15}$ to $3 \times 10^{16}$ [atoms/cm$^{-3}$], and the concentration of the N type drift layer 12b is $1 \times 10^{16}$ to $1 \times 10^{17}$ [atoms/cm$^{-3}$].

The anode electrode 16 is formed on upper surfaces of the N− type diffusion layer 15 and the conductive layers 14. The anode electrode 16 is formed of layered materials of vanadium (V) and aluminum (Al).

The N− type diffusion layer 15 and the anode electrode 16 have a schottky junction therebetween, and form part of the schottky barrier diode SBD.

ADVANTAGES

Next, advantages of the semiconductor device according to the first embodiment will be described with reference to FIG. 1. In the first embodiment, when a voltage is applied to the schottky barrier diode SBD such that a reverse voltage is applied to the schottky barrier diode SBD, as illustrated in FIG. 1, depletion layers D extend from the conductive layers 14 in the two trenches T to the N type drift layer 12b and the N− type diffusion layer 15. When the magnitude of the reverse bias voltage reaches, for example, about 5% of a rated voltage, the depletion layers D extending from the two trenches T are combined (pinched off). As a result, a leak current is suppressed.

As described above, the N− type diffusion layer 15 has an impurity concentration lower than that of the N type drift layer 12b. Therefore, the N− type diffusion layer 15 is entirely depleted at an earlier stage than the N type drift layer 12b. By promoting depletion in the N− type diffusion layer 15 forming a schottky barrier with respect to the anode electrode 16, it is possible to substantially reduce a leak current upon application of a reverse bias.

In addition, the length (depth) L2 in a layered direction of the N− type diffusion layer 15 is equal to or less than half the length L1 of the conductive layer 14. When the length L2 is greater than half of the length L1, while it is possible to promote depletion upon a reverse bias, there is a problem in that a forward voltage Vf increases and the on resistance becomes high upon application of the forward bias. Thus, by making the length L2 equal to or less than half of the length L1, it is possible to expand the depletion layer near the schottky barrier in a state where a reverse bias voltage of about 5% of, for example, the rated voltage is applied. Consequently, it is possible to reduce the leak current upon a reverse bias while maintaining a sufficiently lower on resistance upon application of a forward bias.

[Manufacturing Method]

Next, a manufacturing process of the schottky barrier diode SBD of the semiconductor device according to the first embodiment will be described with reference to FIGS. 2 and 3. FIGS. 2 and 3 are sectional views illustrating the manufacturing process of the semiconductor device according to the first embodiment.

Figure 2A:
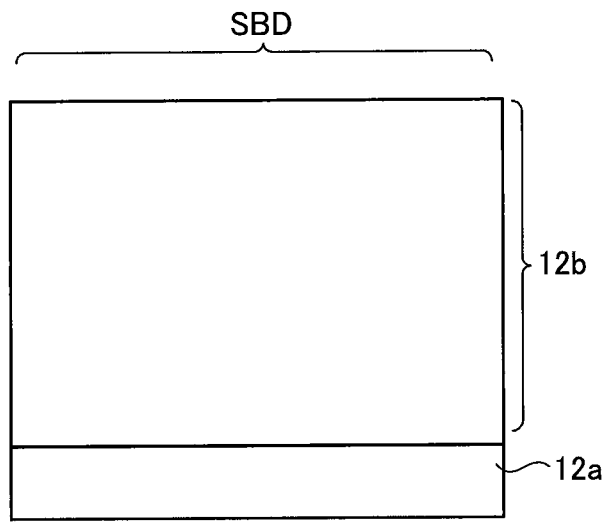
FIG. 2A is a sectional view illustrating a manufacturing process of the semiconductor device according to the first embodiment.
Figure 2B:
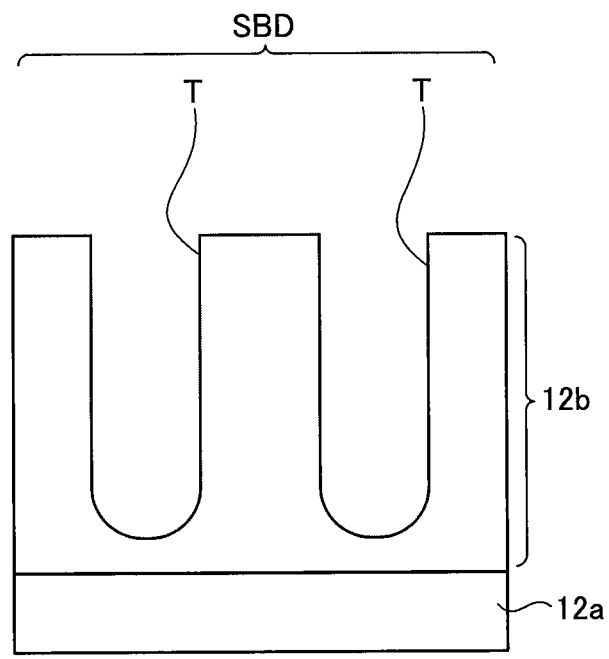
FIG. 2B is a sectional view illustrating the manufacturing process of the semiconductor device according to the first embodiment.

First, as illustrated in FIG. 2A, the N type drift layer 12b is formed on the upper surface of the N+ type semiconductor substrate 12a by, for example, epitaxial growth. Next, as illustrated in FIG. 2B, a plurality of trenches T extending downward from the upper surface of the N type drift layer 12b are formed. The trench T is formed by, for example, dry etching the N type drift layer 12b using photolithography.

Figure 3A:
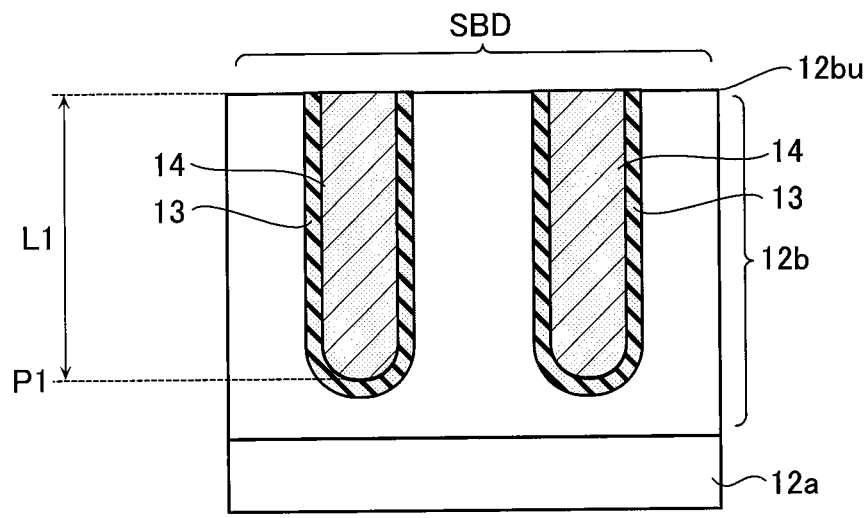
FIG. 3A is a sectional view illustrating the manufacturing process of the semiconductor device according to the first embodiment.

Subsequently, a thermal oxidation process is executed at about 900° C., so that, as illustrated in FIG. 3A, the insulation layer 13 is formed along the inner wall of the trench T. Further, for example, CVD is executed, so that the conductive layer 14 which buries the trench T via the insulation layer 13 is formed.

Figure 3B:
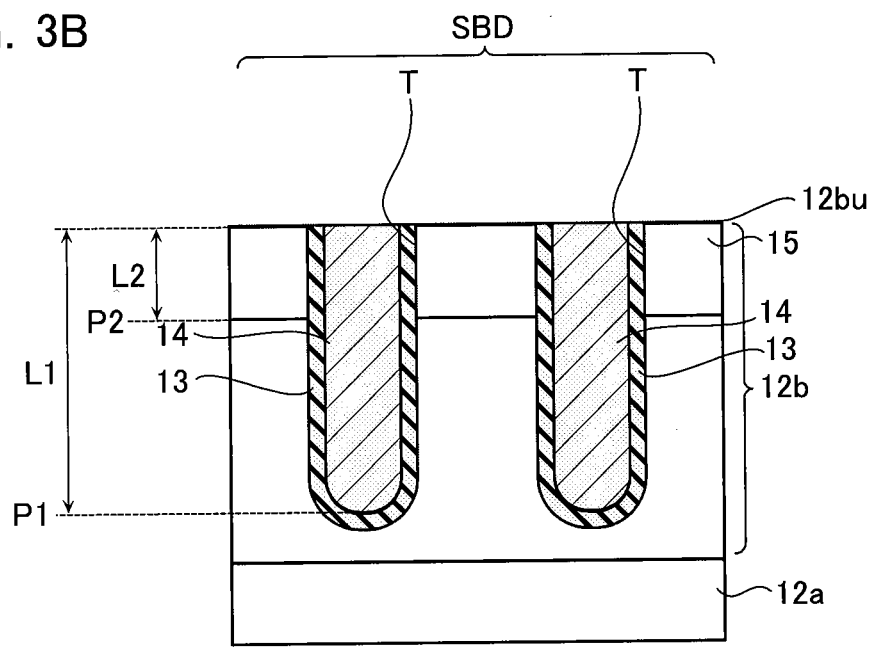
FIG. 3B is a sectional view illustrating the manufacturing process of the semiconductor device according to the first embodiment.

Next, as illustrated in FIG. 3B, by implanting ions, the N− type diffusion layer 15 is formed to reach the position P2 from the upper surface 12bu of the N type drift layer 12b. The acceleration voltage of ion implantation is adjusted such that the length L2 from the upper surface 12bu of the N type drift layer 12b to the position P2 is equal to or less than half the length L1 from the upper surface 12bu of the N type drift layer 12b to the position P1. The N− type diffusion layer 15 is formed by, for example, implanting boron (B) to the upper surface of the N type drift layer 12b such that the polarity is not inverted, and then executing thermal processing of the upper surface.

Subsequently, by using, for example, a spattering method, the anode electrode 16 is formed on the upper surface 12bu of the N type drift layer 12b, and the cathode electrode 11 is formed on the lower surface of the N+ type semiconductor substrate 12a. As a result, the semiconductor device illustrated in FIG. 1 is formed. The anode electrode 16 is formed of layered materials of vanadium (V) and aluminum (Al) which serve as schottky barrier metals. The cathode electrode 11 is formed of three-layered materials of titanium (Ti), nickel (Ni) and gold (Au).

Second Embodiment

Configuration

Figure 4:
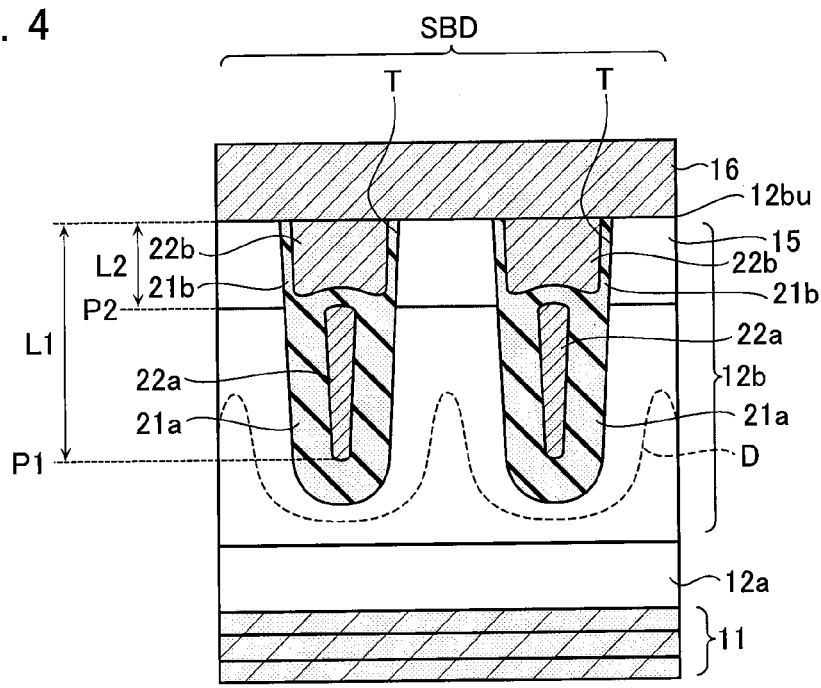
FIG. 4 is a sectional view of a semiconductor device according to a second embodiment.

Next, a layered structure of a semiconductor device according to a second embodiment will be described with reference to FIG. 4. FIG. 4 is a sectional view of the semiconductor device according to the second embodiment. A MOSFET is not illustrated in FIG. 4. Of course, the present embodiment is also applicable to a semiconductor device which has only a schottky barrier diode SED. As illustrated in FIG. 4, the semiconductor device according to the second embodiment differs from that of the first embodiment in the configuration inside trenches T. In addition, in the second embodiment, the same configurations as in the first embodiment will be assigned the same reference numerals and will not be described.

In the second embodiment, in the trench T, insulation layers 21a and 21b and conductive layers 22a and 22b are provided instead of the insulation layer 13 and the conductive layer 14 according to the first embodiment. The conductive layer 22a is electrically connected to the anode electrode 16 at an element terminal (not illustrated). The conductive layer 22b is electrically connected to the anode electrode 16.

The insulation layer 21a is formed along the inner wall of the trench T in the lower layer below the position P2. The insulation layer 21a has a larger film thickness than that of the insulation layer 13 according to the first embodiment, for example, the film thickness of about 100 to 800 nm. The conductive layer 22a is formed to bury the inside of the trench T in the lower layer below the position P2 via the insulation layer 21a. The conductive layer 22a extends downward from the position P2 to the position P1. The conductive layer 22a is formed to have a smaller width in the lateral direction to the plane of paper in FIG. 4 than that of the conductive layer 14 according to the first embodiment, and has, for example, the width of about 100 to 300 nm.

The insulation layer 21b is formed along the inner wall of the trench T in the upper layer above the position P2. The insulation layer 21b is formed to have a film thickness thinner than that of the insulation layer 21a. The conductive layer 22b is formed to bury the trench T in the upper layer above the position P2 via the insulation layer 21b.

As described above, the conductive layer 22b is electrically connected to the anode electrode 16. Further, the conductive layer 22a is also electrically connected to the anode electrode 16. Therefore, when a voltage is applied to the schottky barrier diode SBD such that a reverse voltage is applied to the schottky barrier diode SBD, similar to the first embodiment, depletion layers D extend from the conductive layers 22a and 22b in the two trenches T to the N type drift layer 12b and the N− type diffusion layer 15. As a result, a leak current is suppressed. The impurity concentration of the N− type diffusion layer 15 has an impurity concentration lower than that of the N type drift layer 12b, and the N− type diffusion layer 15 is entirely depleted at an earlier stage than the N type drift layer 12b. By promoting depletion in the N− type diffusion layer 15 forming a schottky barrier with respect to the anode electrode 16, it is possible to significantly reduce a leak current upon application of a reverse bias.

Further, similar to the first embodiment, by making the length L2 equal to or less than half of the length L1, it is possible to reduce the leak current upon a reverse bias while maintaining a sufficiently lower on resistance upon application of a forward bias.

[Manufacturing Method]

Figure 5:
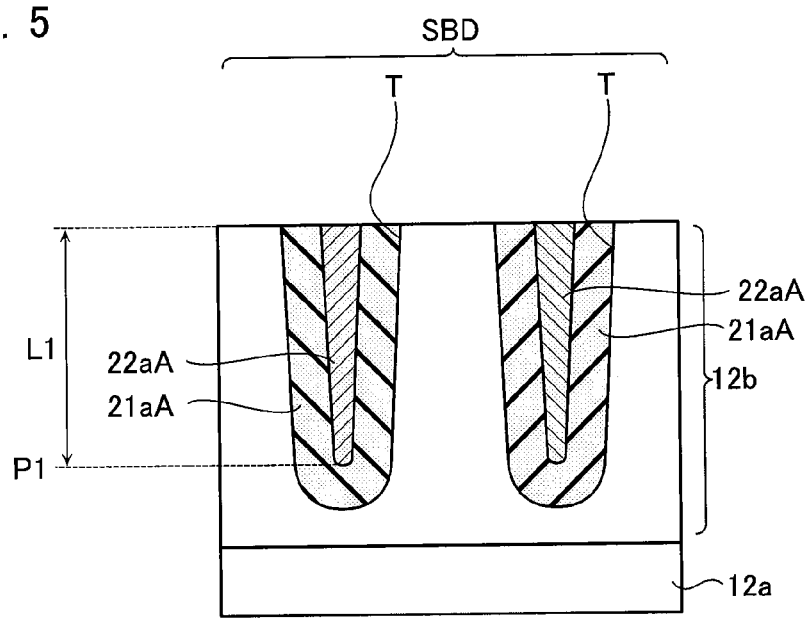
FIG. 5 is a sectional view illustrating a manufacturing process of the semiconductor device according to the second embodiment.

Next, a manufacturing process of the schottky barrier diode SBD of the semiconductor device according to the second embodiment will be described with reference to FIGS. 5 and 7. FIGS. 5 to 7 are sectional views of the manufacturing process of the semiconductor device according to the second embodiment.

First, the same manufacturing process as in FIGS. 2A and 2B according to the first embodiment will be executed. Subsequently, a thermal oxidation process is executed at about 1100° C., so that, as illustrated in FIG. 5, an insulation layer 21aA is formed along the inner wall of the trench T. Further, for example, CVD is executed, so that a conductive layer 22aA which buries the trench T via the insulation layer 21aA is formed.

Figure 6A:
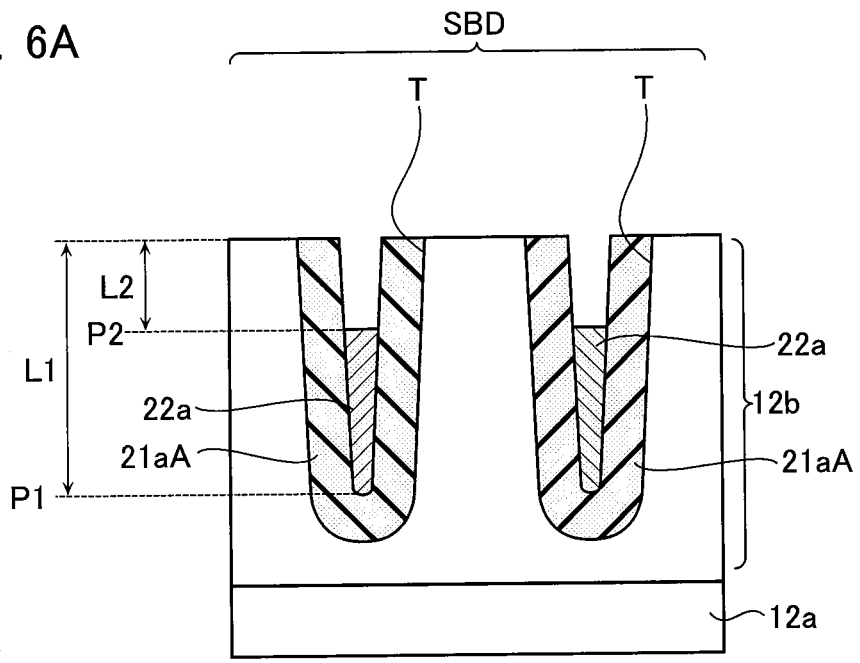
FIG. 6A is a sectional view illustrating the manufacturing process of the semiconductor device according to the second embodiment.

Next, as illustrated in FIG. 6A, the upper surface of the conductive layer 22aA is dug to the position P2 by dry etching using photolithography to form the conductive layer 22a.

Figure 6B:
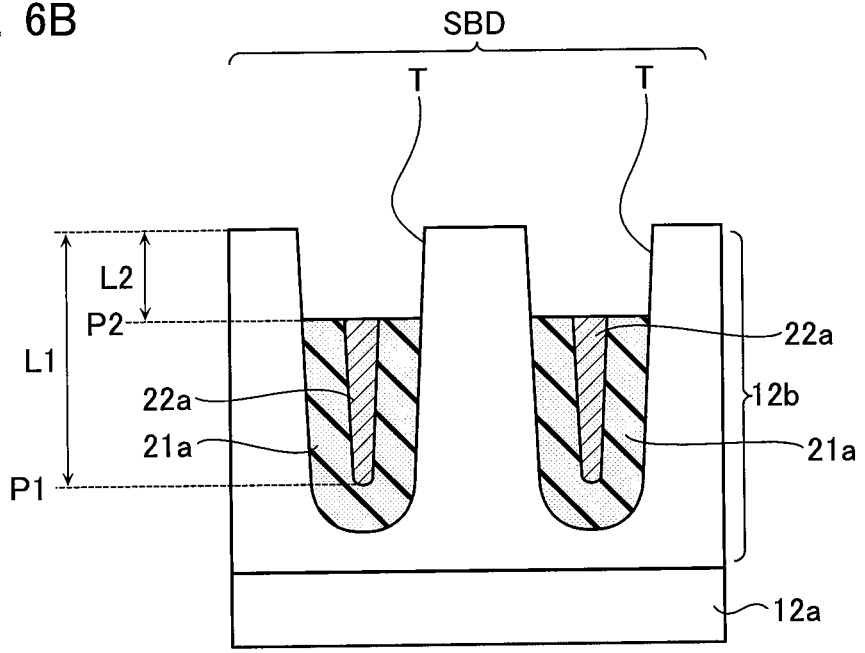
FIG. 6B is a sectional view illustrating the manufacturing process of the semiconductor device according to the second embodiment.

Subsequently, as illustrated in FIG. 6B, the upper surface of the insulation layer 21aA is further dug to the position P2 by wet etching to form the insulation layer 21a.

Figure 7A:
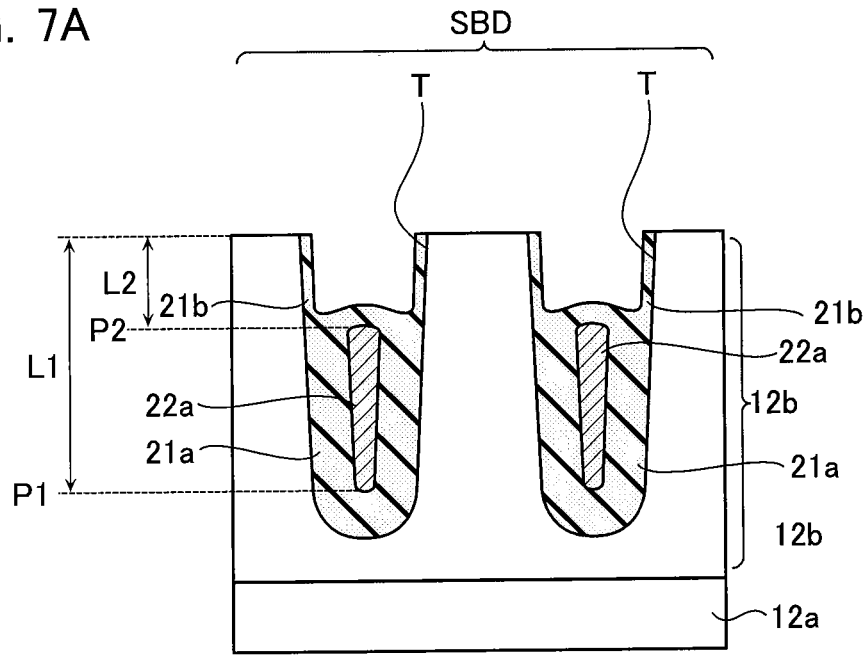
FIG. 7A is a sectional view illustrating the manufacturing process of the semiconductor device according to the second embodiment.
Figure 7B:
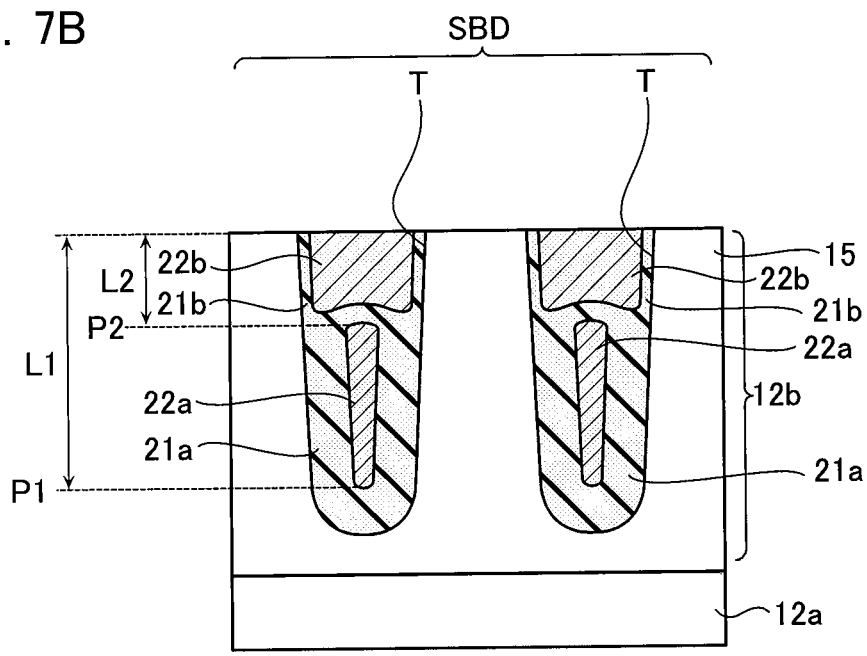
FIG. 7B is a sectional view illustrating the manufacturing process of the semiconductor device according to the second embodiment.

Subsequently, a thermal oxidation process is executed at about 900° C., so that, as illustrated in FIG. 7A, the insulation layer 21b is formed along the inner wall of the trench T in the upper layer above the position P2. Further, for example, CVD is executed, so that, as illustrated in FIG. 7B, the conductive layer 22b which buries the trench T via the insulation layer 21b is formed in the upper layer above the position P2. Further, the same manufacturing process as in FIG. 3B according to the first embodiment is executed and, after the N− type diffusion layer 15 is formed, the anode electrode 16 and the cathode electrode 11 are formed. In this manner, the semiconductor device according to the second embodiment is manufactured.

Third Embodiment

Configuration

Figure 8:
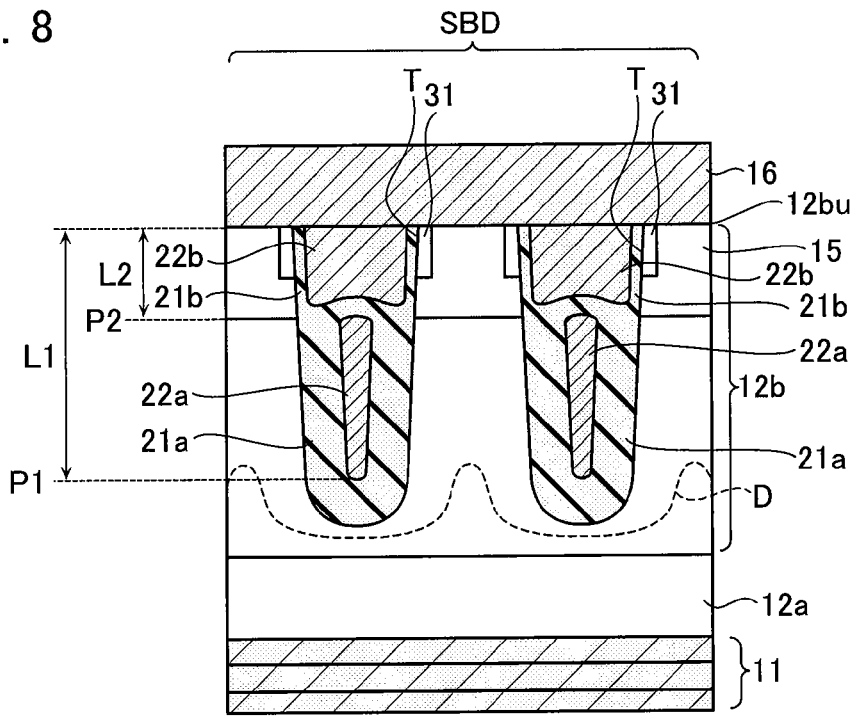
FIG. 8 is a sectional view of a semiconductor device according to a third embodiment.

Next, a layered structure of a semiconductor device according to a third embodiment will be described with reference to FIG. 8. FIG. 8 is a sectional view of the semiconductor device according to the third embodiment. A MOSFET is not illustrated in FIG. 8. Of course, the present embodiment is also applicable to a semiconductor device which has only a schottky barrier diode SBD. As illustrated in FIG. 8, the semiconductor device according to the third embodiment has P type diffusion layers 31 provided between an insulation layer 22b and an N− type diffusion layer 15. In this regard, the third embodiment differs from the second embodiment. In the third embodiment, the other configurations are the same as in the second embodiment, and therefore will be assigned the same reference numerals and will not be described.

In the third embodiment, the P type diffusion layers 31 can further promote generation of a depletion layer D near the N− type diffusion layer compared to the second embodiment. That is, according to the third embodiment, it is possible to further improve the advantage of suppressing a leak current upon a reverse bias compared to the second embodiment.

[Manufacturing Process]

Next, a manufacturing method of a schottky barrier diode SBD of the semiconductor device according to the third embodiment will be described. In the third embodiment, the same manufacturing process as in FIGS. 5 to 7B according to the second embodiment will be executed. Further, in the state illustrated in FIG. 7B, boron (B) is implanted on the lateral surfaces of the insulation layer 21b via a resist which has openings only in the lateral surfaces of the insulation layer 21b to from P type diffusion layers 31. Then, the same manufacturing process as in the second embodiment is executed to manufacture the semiconductor device according to the third embodiment.

Fourth Embodiment

Configuration

Figure 9:
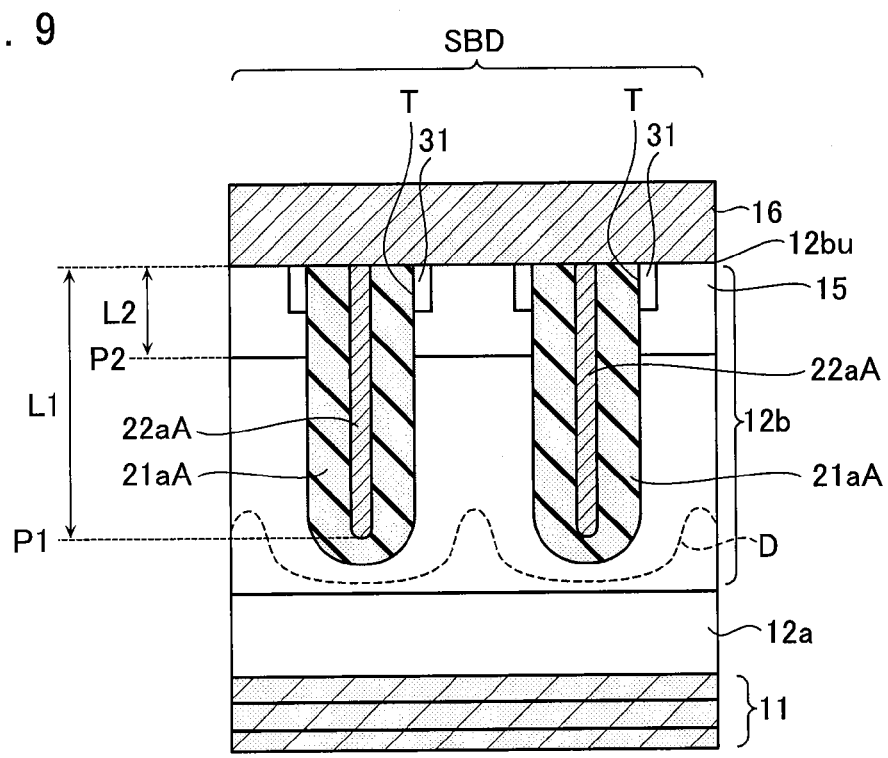
FIG. 9 is a sectional view of a semiconductor device according to a fourth embodiment.

Next, a layered structure of a semiconductor device according to a fourth embodiment will be described with reference to FIG. 9. FIG. 9 is a sectional view of the semiconductor device according to the fourth embodiment. A MOSFET is not illustrated in FIG. 9. Of course, the present embodiment is also applicable to a semiconductor device which has only a schottky barrier diode SBD. As illustrated in FIG. 9, the semiconductor device according to the fourth embodiment differs from that of the first embodiment in the configuration inside trenches T. Further, similar to the third embodiment, the semiconductor device according to the fourth embodiment has P type diffusion layers 31. In addition, in the fourth embodiment, the same configurations as in the first embodiment will be assigned the same reference numerals and will not be described.

In the fourth embodiment, an insulation layer 21aA and a conductive layer 22aA are provided in the trench T. The insulation layer 21aA has a larger film thickness than that of the insulation layer 13 according to the first embodiment, for example, the film thickness of about 100 to 800 nm. The conductive layer 22aA is formed to have a smaller width in the lateral direction to the plane of paper than that of the conductive layer 14 according to the first embodiment, and has, for example, the width of about 100 to 300 nm. The conductive layer 22aA is electrically connected to the anode electrode 16.

The P type diffusion layer 31 is formed between the insulation layer 21aA and the N− type diffusion layer 15. The fourth embodiment provides the same operation and the same advantage as the third embodiment.

[Manufacturing Process]

Next, a manufacturing method of a schottky barrier diode SBD of the semiconductor device according to the fourth embodiment will be described. In the fourth embodiment, the same manufacturing process as in FIG. 5 according to the second embodiment will be executed. Further, the processes in FIGS. 6A to 7B are skipped, and the N− type diffusion layer 15, the anode electrode 16 and the cathode electrode 11 are formed to manufacture the semiconductor device according to the fourth embodiment.

As described above, in the fourth embodiment, it is possible to skip more manufacturing processes than the second embodiment and, consequently, reduce manufacturing cost more than the second embodiment.

Fifth Embodiment

Configuration

Figure 10:
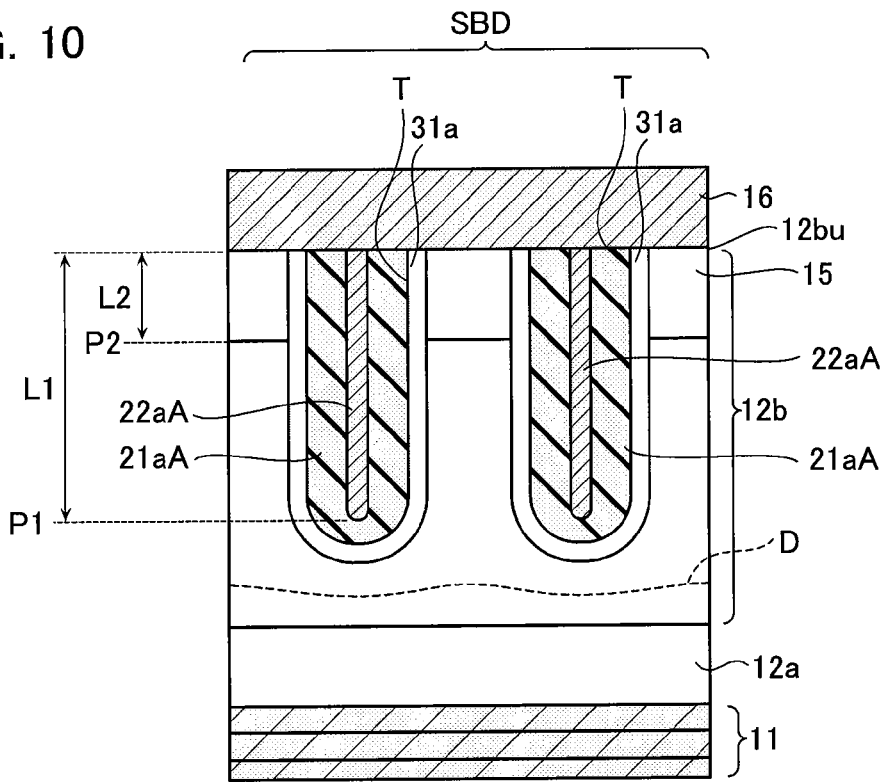
FIG. 10 is a sectional view of a semiconductor device according to a fifth embodiment.

Next, a layered structure of a semiconductor device according to a fifth embodiment will be described with reference to FIG. 10. FIG. 10 is a sectional view of the semiconductor device according to the fifth embodiment. A MOSFET is not illustrated in FIG. 10. Of course, the present embodiment is also applicable to a semiconductor device which has only a schottky barrier diode SBD. In addition, in the fifth embodiment, the same configurations as in the fourth embodiment will be assigned the same reference numerals and will not be described.

In the fifth embodiment, a P type diffusion layer 31a is formed not only between an insulation layer 21aA and an N− type diffusion layer 15 but also between the insulation layer 21aA and an N type drift layer 12b. Further, the insulation layer 21aA is made of boron silicate glass (BSG). In addition, the P type diffusion layer 31a is made of boron thermally diffused from the inside of the insulation layer 21aA. With regard to the above point, the fifth embodiment differs from the fourth embodiment. In addition, in the fifth embodiment, the same configurations as in the fourth embodiment will be assigned the same reference numerals and will not be described.

In the fifth embodiment, the P type diffusion layer 31a can suppress a leak current more than the fourth embodiment, and improve the withstand voltage.

[Manufacturing Process]

Next, a manufacturing method of a schottky barrier diode SBD of the semiconductor device according to the fifth embodiment will be described. In the fifth embodiment, the same manufacturing process as in the fourth embodiment will be executed. However, in the fifth embodiment, the insulation layer 21aA is made of boron silicate glass (BSG). Further, thermal processing is applied to the insulation layer 21aA to thermally diffuse boron (B) in the insulation layer 21aA. As a result, the P type diffusion layer 31a is formed around the insulation layer 21aA.

As described above, in the fifth embodiment, the P type diffusion layer 31a is formed by thermal diffusion. Consequently, in the fifth embodiment, it is possible to narrow an area for forming the P type diffusion layer 31a compared to a case where the P type diffusion layer 31a is formed by ion implantation. That is, in the fifth embodiment, it is possible to suppress a decrease of a bonding area (schottky area) of the anode electrode 16 and the N− type diffusion layer 15. Further, in the fifth embodiment, it is possible to suppress variation of the area for forming the P type diffusion layer 31a compared to a case where the P type diffusion layer 31a is formed by ion implantation. Consequently, in the fifth embodiment, it is possible to suppress variation of the withstand voltage.

Sixth Embodiment

Configuration

Figure 11:
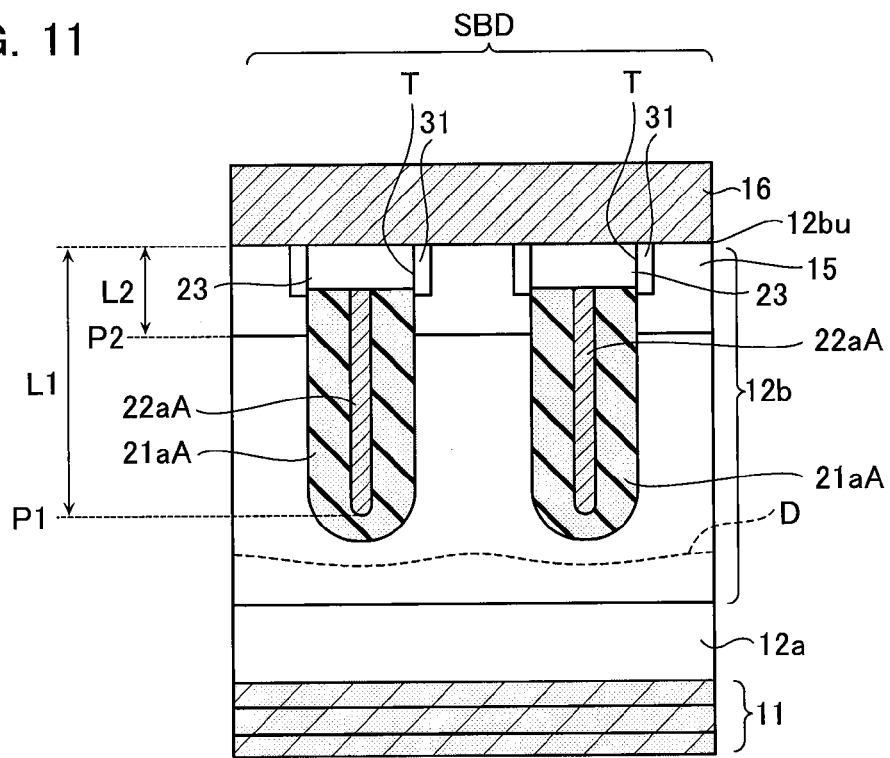
FIG. 11 is a sectional view of a semiconductor device according to a sixth embodiment.

Next, a layered structure of a semiconductor device according to a sixth embodiment will be described with reference to FIG. 11. FIG. 11 is a sectional view of the semiconductor device according to the sixth embodiment. A MOSFET is not illustrated in FIG. 11. Of course, the present embodiment is also applicable to a semiconductor device which has only a schottky barrier diode SBD. In addition, in the sixth embodiment, the same configurations as in the third embodiment will be assigned the same reference numerals and will not be described.

As illustrated in FIG. 11, the sixth embodiment provides substantially the same configuration as in the third embodiment. In the sixth embodiment, a semiconductor layer 23 is provided instead of the insulation layer 21b and the conductive layer 22b according to the third embodiment. The semiconductor layer 23 is made of polysilicon containing boron silicate glass (BSG) or polysilicon containing boron. In addition, the conductive layer 22aA is electrically connected to the anode electrode 16 at an element terminal (not illustrated).

[Manufacturing Process]

Next, a manufacturing method of a schottky barrier diode SBD of the semiconductor device according to the sixth embodiment will be described. In the sixth embodiment, the same manufacturing process as in FIGS. 5 to 6B according to the second embodiment will be executed. After the process illustrated in FIG. 6B, the semiconductor layer 23 which buries the trench T in the upper layer above the position P2 is formed by the CVD method. The semiconductor layer 23 is made of polysilicon containing boron silicate glass (BSG) or polysilicon containing boron. Further, thermal processing is applied to the semiconductor layer 23 to thermally diffuse boron (B) in the semiconductor layer 23. As a result, the P type diffusion layers 31 are formed on the lateral surfaces of the semiconductor layer 23.

As described above, in the sixth embodiment, the P type diffusion layers 31 are formed by thermal diffusion. Therefore, in the sixth embodiment, it is possible to narrow areas for forming the P type diffusion layers 31 compared to a case where the P type diffusion layers 31 are formed by ion implantation. That is, in the sixth embodiment, it is possible to suppress a decrease of a bonding area (schottky area) of the anode electrode 16 and the N− type diffusion layer 15. Further, in the sixth embodiment, it is possible to suppress variation of the areas for forming the P type diffusion layers 31 compared to a case where the P type diffusion layers 31 are formed by ion implantation. Consequently, in the sixth embodiment, it is possible to suppress variation of the withstand voltage.

Seventh Embodiment

Configuration

Figure 12:
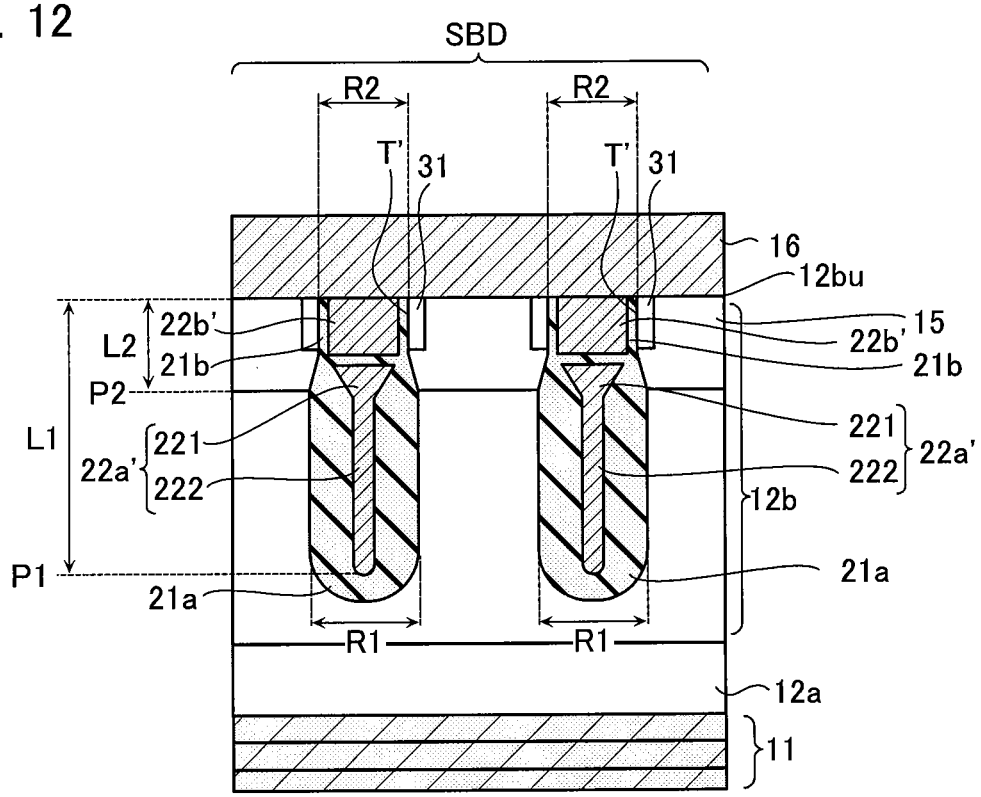
FIG. 12 is a sectional view of a semiconductor device according to a seventh embodiment.

Next, a layered structure of a semiconductor device according to a seventh embodiment will be described with reference to FIG. 12. FIG. 12 is a sectional view of the semiconductor device according to the seventh embodiment. A MOSFET is not illustrated in FIG. 12. Of course, the present embodiment is also applicable to a semiconductor device which has only a schottky barrier diode SBD. In addition, in the seventh embodiment, the same configurations as in the third embodiment will be assigned the same reference numerals and will not be described.

In the seventh embodiment, as illustrated in FIG. 12, trenches T' and conductive layers 22a' and 22b' are provided instead of the trenches T and conductive layers 22a and 22b according to the third embodiment. The conductive layer 22a' is electrically connected to the anode electrode 16 at an element terminal (not illustrated). The conductive layer 22b' is electrically connected to the anode electrode 16.

In the seventh embodiment, the trench T' has a diameter R1 in an area of an N type drift layer 12b. By contrast with this, the trench T' has a diameter R2 (R2<R1) on the upper surface of the N− type diffusion layer 15.

The conductive layer 22a' has a tapered portion 221 and a columnar portion 222. The tapered portion 221 is formed in a tapered shape such that its diameter becomes narrow from the upper end to the lower end. The columnar portion 222 extends downward from the lower end of the tapered portion 221, and is formed in a columnar shape having substantially the same diameter from the upper end to the lower end. The conductive layer 22b' has a smaller diameter than that of the conductive layer 22b according to the third embodiment.

As described above, the diameter R2 of the upper end of the trench T' is formed smaller than the diameter R1 of the lower end of the trench T'. As a result, in the seventh embodiment, it is possible to increase a bonding area (schottky area) of the anode electrode 16 and the N− type diffusion layer 15 more than in the third embodiment.

[Other]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device comprising:
   a cathode electrode;
   a semiconductor substrate of a first conductivity type electrically connected to the cathode electrode and having a first impurity concentration;
   a semiconductor layer of the first conductivity type formed on the semiconductor substrate and having a second impurity concentration lower than the first impurity concentration;
   a plurality of first trenches formed in the semiconductor layer to extend downward from an upper surface of the semiconductor layer;
   a plurality of insulation layers each formed on each inner wall of the first trenches;
   a plurality of conductive layers each formed in the first trenches on the insulation layers and extending downward from the upper surface of the semiconductor layer to a first position;
   a first semiconductor diffusion layer of the first conductivity type reaching a second position from the upper surface of the semiconductor layer, positioned between the first trenches, and having a third impurity concentration lower than the second impurity concentration; and
   an anode electrode formed on upper surfaces of the first semiconductor diffusion layer and the conductive layers, and having a schottky junction with the first semiconductor diffusion layer, and
   a length from the upper surface of the semiconductor layer to the second position being equal to or less than half a length from the upper surface of the semiconductor layer to the first position.

2. The semiconductor device according to claim 1, further comprising:

a second trench formed in the semiconductor layer to extend downward from the upper surface of the semiconductor layer;

a gate insulation film formed in an inner wall of the second trench; and a gate electrode of MOSFET formed to bury the second trench via the gate insulation film.

3. The semiconductor device according to claim 1, wherein the cathode electrode includes titanium, nickel and gold.

4. The semiconductor device according to claim 1, wherein the anode electrode includes vanadium and aluminum.

5. The semiconductor device according to claim 1, wherein each of the insulation layers comprises:

a first insulation layer formed on an inner wall of one of the first trenches in a lower layer below the second position, and a second insulation layer formed on the inner wall of one of the first trenches in an upper layer above the second position;

each of the conductive layers comprises:

a first conductive layer formed in one of the first trenches on the first insulation layer in the lower layer below the second position and extending downward from the second position to the first position, and a second conductive layer formed in one of the first trenches on the second insulation layer in the upper layer above the second position and reaching the second position from the upper surface of the semiconductor layer; and the first conductive layer is electrically connected to the anode electrode.

* * * * *